United States Patent [19]
de Vall

[11] Patent Number: 5,574,470
[45] Date of Patent: Nov. 12, 1996

[54] RADIO FREQUENCY IDENTIFICATION TRANSPONDER APPARATUS AND METHOD

[75] Inventor: Franklin B. de Vall, Boulder, Colo.

[73] Assignee: Palomar Technologies Corporation, Carlsbad, Calif.

[21] Appl. No.: 540,785

[22] Filed: Oct. 11, 1995

Related U.S. Application Data

[63] Continuation-in-part of Ser. No. 316,694, Sep. 30, 1994.
[51] Int. Cl.$^6$ ...................................... H01Q 1/36
[52] U.S. Cl. .................... 343/895; 343/872; 340/572
[58] Field of Search .................... 343/895, 872, 343/873, 742, 867; 340/572, 505; 29/848, 600; H01Q 1/36

[56] References Cited

U.S. PATENT DOCUMENTS

| | | | |
|---|---|---|---|
| 4,598,276 | 7/1986 | Tait | 343/895 |
| 4,835,524 | 5/1989 | Lamond et al. | 343/895 |
| 4,843,404 | 6/1989 | Benge et al. | 343/895 |
| 5,059,950 | 10/1991 | Perchak | 343/895 |

*Primary Examiner*—Hoanganh Le
*Attorney, Agent, or Firm*—Rodney F. Brown

[57] ABSTRACT

A transponder is formed of a very thin flexible substrate (10) on opposite sides of which are formed first (26) and second (31) series connected halves of a single antenna coil having ends connected to an integrated circuit die (50) mounted to a corner of the substrate. A plurality of bond pads (12a–12e) and programming pads (14a–14e) are also formed on the substrate and operatively connected to couple the antenna coils and the programming pads through the bond pads to the integrated circuit die. Unique configurations and arrangements of a die mounting site (46), bond pads (12a–12e), program pads (14a–14e), and vias (22,24) through the substrate enable an inexpensive simple construction. Protective laminates (58,60) on either side of the substrate are bonded to one another around the edges that circumscribe the substrate and also are bonded to one another at interior portions through a slot (20) formed in the substrate. In one embodiment narrow closely spaced coil turns are grouped in a perimetrical area of the substrate, leaving a large area in the center of the substrate free of antenna coil turns. The thin flexible substrate is stiffened in the area of the die and bond site by thin copper stiffener sheets (46,202,234) that are laid down as part of the antenna coil forming process.

27 Claims, 6 Drawing Sheets

RADIO FREQUENCY IDENTIFICATION TRANSPONDER APPARATUS AND METHOD

This application is a continuation-in-part of my prior application for RF Transponder System With Parallel Resonant Interrogation and Series Resonant Response, U.S. Ser. No. 08/316,694, filed Sep. 30, 1994, the disclosure of which is incorporated herein by this reference as though fully set forth.

BACKGROUND OF THE INVENTION

1. Field of the Invention

The present invention relates to radio frequency identification transponders, and more particularly concerns transponders having an improved low cost configuration.

2. Description of Related Art

RF transponder systems are used to monitor, at a short distance, for the presence of an object associated with a transponder, to identify the object and/or to communicate various types of information about the object back to a receiving station. Such systems typically employ an exciter/reader that transmits an RF excitation signal, and a transponder that is energized by the excitation signal to transmit a signal including an identification code and/or other information back to the exciter/reader. The transponder receives a radio frequency signal, or, more specifically, is energized by the RF magnetic field and forms a response signal that will identify the transponder and which may provide additional information, and then re-transmit a response signal back to the exciter. The exciter includes a receiver that receives the response signal and processes the information it contains.

In one such system, such as a radio frequency identification system made by Hughes Identification Devices, a subsidiary of Hughes Aircraft Company, the exciter/transmitter includes a transmit/receive coil which sends out a radio frequency excitation signal. The same coil also receives the response signal from a transponder. The response is formatted by the transponder as a frequency shift keying (FSK) signal that is received, processed and demodulated by the exciter.

One type of transponder uses an antenna formed on a thin PC circuit board made of a rigid dielectric on which is mounted an integrated circuit transponder chip. Typical applications include transponder tags on clothing airline baggage identification, and security access in general. Transponder cards, which may be the size of a credit card, can be used in many applications where bar codes and magnetic strip tags are presently used.

Devices of this type are of relatively limited range, in the order of between two to three inches up to about thirty inches. Accordingly, performance, largely defined by the range of the system, is a major criterion for further development. Performance is limited by, among other things, the ability of the transponder antenna to clearly receive energy and re-transmit appropriate signals.

In prior coil devices, antenna coil Q and inductance may vary from transponder to transponder because of differences in manufacturing configurations of the antenna coils. This may result in varying and unreliable read range performance. The specific physical position and proximity of coil turns with respect to each other and variation in pressure applied to the coils because of variation of protective cover lamination will also vary reading range performance in prior devices. Wire connections from the coil, made directly to a circuit on board (COB), are subject to breakage because of flexure, vibration, compressive forces and thermal expansion and contractions. In addition, wires that form the turns of the coil itself are subject to breakage for the same reasons. Because of the use of a chip on a circuit board or a printed circuit board, it is difficult, if not impossible, to obtain a sufficiently thin final assembly or one that will meet standards of the International Standard Organization.

Low antenna coil Q often results from use of epoxy glass printed circuit board technology, having relatively large spacing between coils. Such arrangements, accordingly, require more turns for a given inductance. Present designs employing large line and space widths of 5 to 10 mils or more require turns to cover all or most of the available area, resulting in a lower inductance, lower Q, and fewer flux lines encompassed in a given field, all of which result in lower performance in terms of read range. Because prior designs require coil turns to cover substantially the entire area of a small credit card size transponder, the area within and surrounded by the coil that receives magnetic flux lines of a given field is relatively small, thus decreasing read range and decreasing coil Q.

Accordingly, it is an object of the present invention to provide a transponder and method for making a transponder that avoids or minimizes above-mentioned problems.

SUMMARY OF THE INVENTION

In carrying out principles of the present invention in accordance with a preferred embodiment thereof, a thin dielectric substrate is provided, having first and second sides, a die mounting site on the first side, a plurality of bond pads and a first multi-turn flat antenna coil on the first side. A first via extends through the substrate and is connected to an inner end of the first coil, and a second via is formed through the substrate adjacent one of the bond pads. A second multi-turn antenna coil is formed on the second side of the substrate, having a first end at an interior portion of the substrate connected to the first via and having a second end connected to the second via on the second side of the substrate. A protective coating is formed over the first and second sides of the substrate and over the antenna coils, leaving uncovered the die bond site and bond pads. The second via on the first side of the substrate is connected to one of the bond pads. A die is mounted at the die bond site and electrically connected to the bond pads. A nonconductive encapsulation is provided over the die and bond pads and first and second protective laminates are secured to each other, covering both sides of the substrate and protecting both antenna coils die and bond pads.

According to a feature of the invention, a plurality of programming pads is formed on the first side of the substrate with programming leads interconnecting the programming pads and the bond pads.

According to another feature of the invention, an interior slot is formed through the substrate and the protective laminates on opposite sides are bonded to one another through the interior slot and around the perimeter of the substrate.

According to another feature of the invention, the coils formed on the first and second sides of the substrate are formed in relatively narrow perimetrical areas on the first and second sides so as to circumscribe interior portions of the thin substrate, whereby a major portion of the substrate on both first and second sides is free of the antenna coils to provide a large central area for accepting magnetic flux lines.

DESCRIPTION OF PREFERRED EMBODIMENTS

My co-pending application identified above, Ser. No. 08/316,694, describes transponders operating with a very high degree of efficiency with greater inductance and capacitance per unit area, utilizing mutual self-inductance between coils on opposite sides of a thin substrate and in which close proximity of coils on opposite sides enhances distributed capacitance. The arrangements, configurations, structure, and operations of the transponders described in the co-pending application are all applicable to the arrangements and configurations described herein, and the presently described configurations advantageously exhibit the improved functional features and greater range described in the co-pending application.

Configurations to be described in the present application show further details of improved physical and electrical arrangements of components of specific transponder proximity identification cards and laundry tags, as will be described in detail below.

Figure 1:
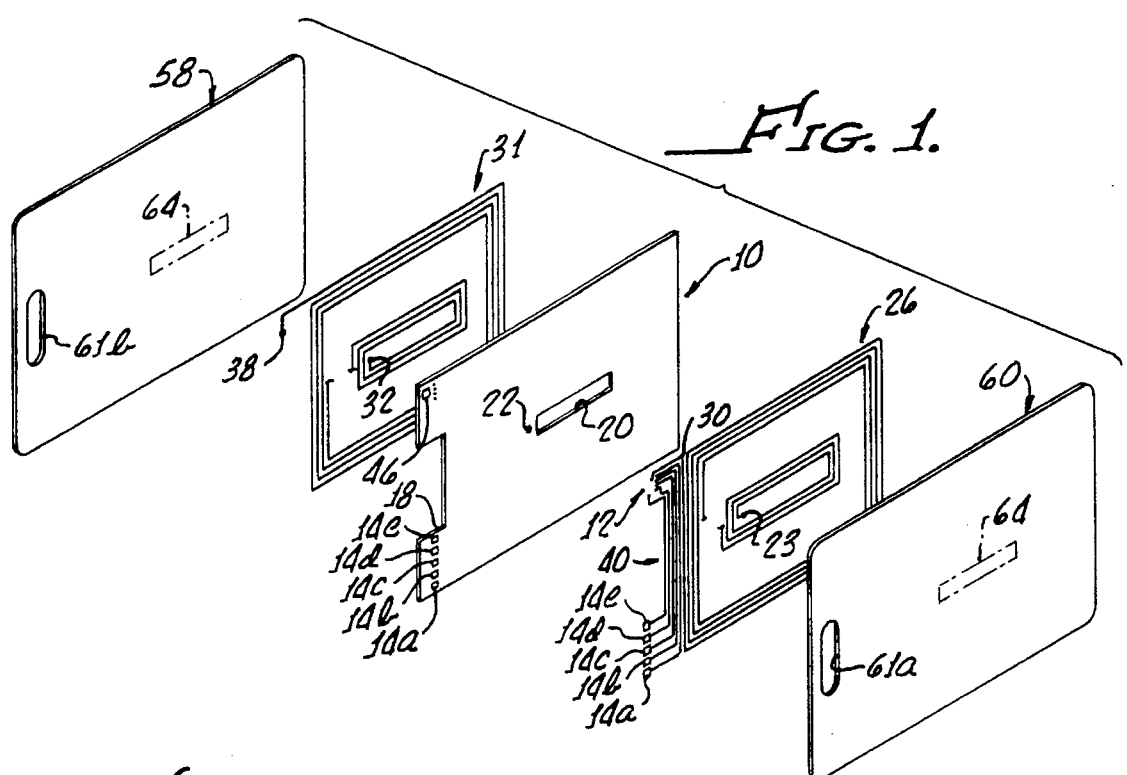
FIG. 1 is an exploded pictorial view of portions of a personal identification proximity card transponder incorporating principles of the present invention.

As shown in FIG. 1, a thin flexible dielectric substrate 10 formed of a polyamide or polyester, having a thickness not greater than about 1 mil (about 25 microns), is formed with a plurality of bond pads 12a–12e, a plurality of program pads 14a–14e, and a die bond site 46. The substrate is generally rectangular in configuration, having a dimension of about 2 inches by 3 ½ inches, with a rebated or notched portion 18 formed in a short edge thereof. An elongated slot 20 is formed in a central portion of the substrate and has one of its ends adjacent a via 22 that extends through the substrate. A second or outer via 24 extends through the substrate adjacent the bond pads 12a–12e.

Formed on a first side of the thin substrate is a first antenna coil 26 wound in a clockwise direction, as viewed in FIG. 1, from a connection of one end of the coil to the via 22 to a connection of the other end of the coil at a point 30 to one of the bond pads, such as pad 12b. An identical coil is formed on the obverse side of the substrate 10 with an inner end 32 connected by means of via 22 to the end 23 of the first coil 26, and has an outermost end 38 that is connected to the outer via 24 on the obverse side of the substrate 10. The turns of the two coils are precisely aligned and are in registration with one another. The two coils are connected in series and wound continuously in a single direction, which is clockwise, for example, as considered when starting from end 38 of the second coil 31 and following this coil around to its inner end 32, thence to the inner end of the second coil 23 at via 22 and continuing in a clockwise direction to the outer end 30 of coil 26. The precise alignment and mutual registration of the two coils and their close proximity to one another, being separated only by the very thin 1 mil thickness of the dielectric, provides for high mutual inductance and self capacitance.

Figure 2:
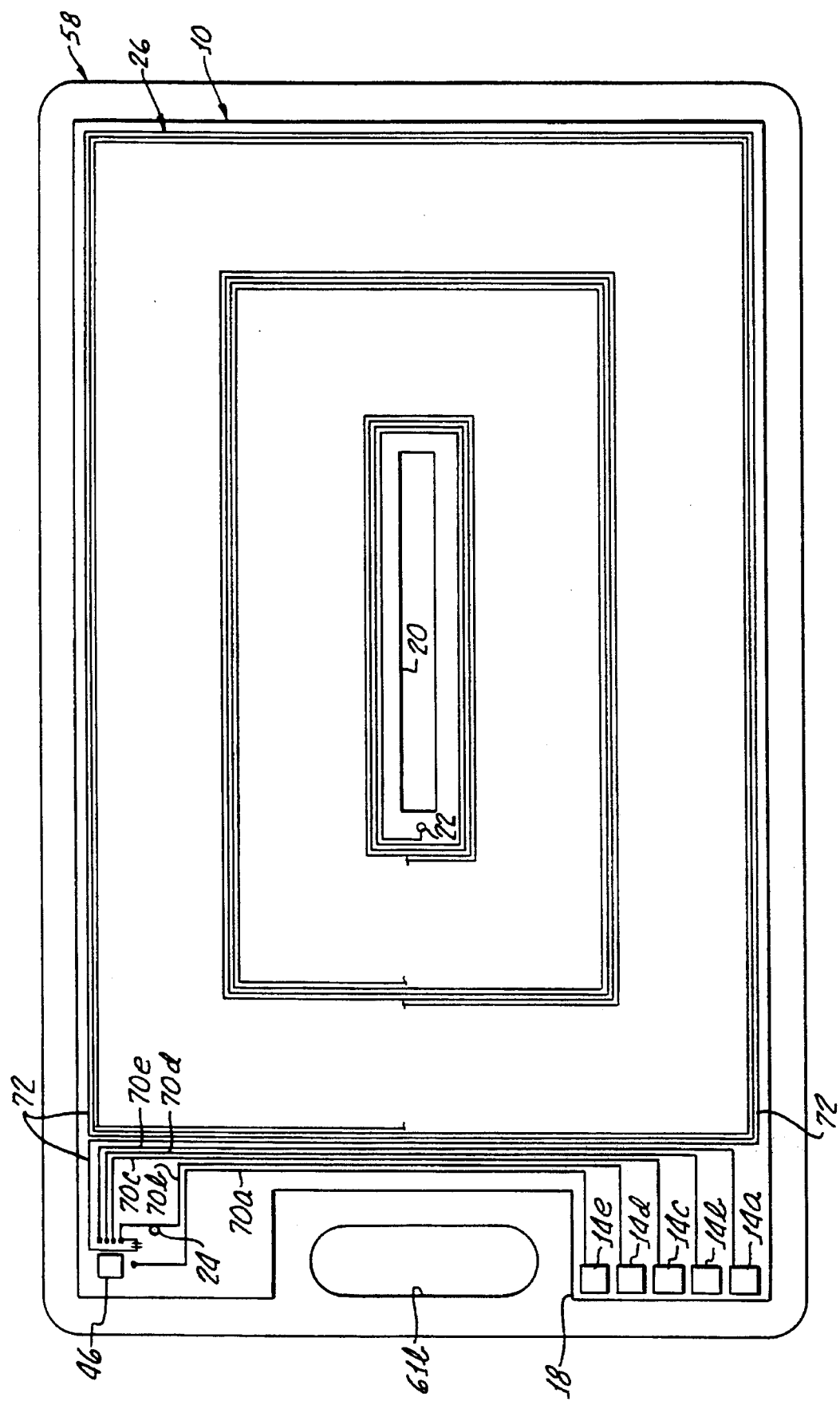
FIG. 2 is a plan view of one side of the card of FIG. 1 with certain protective layers removed.

A plurality of connecting leads 40 connect the five programming pads 14a–14e to the five bond pads 12a–12e. These program connecting leads include a lead 70b (FIG. 3) that connects to the outer via 24 on the near or first side of the substrate 10. A die bond site 46 is formed on the first side of the substrate at one corner adjacent the bond pads 12a–12e. A die 50 (see FIG. 3), not shown in FIGS. 1 and 2, is mounted on the die bond site. The capacitance between the two closely spaced coils may be augmented by a capacitor chip mounted on the substrate adjacent the bond pads and die bond site. The capacitor would be connected in parallel across the antenna (see FIG. 4).

The assembly of substrate, coils, die, etc. is laminated to and sandwiched between first and second protective plastic layers or covers 58,60, each having a configuration similar to the overall rectangular configuration of the substrate but being larger in each dimension. The two plastic covers, which may be a PVC material, are bonded to one another under heat and pressure so that the perimetrical edges of the plastic covers which extend beyond the area of the enclosed or sandwiched substrate 10 will flow to and adhesively bond to one another. The covers 58,60 will also flow to and adhesively bond to one another at central areas of the covers, generally indicted by dotted line 64 in FIG. 1, which effectively flow through the interior slot 20 formed in the substrate 10. Thus the two PVC covers are fixedly secured to one another around the entire perimeter of the device and also over an area of the interior portion of the device. The covers, which may be a PVC, for example, do not generally adhere to either the dielectric substrate 10, the conductive leads or pads formed on its surface, nor to thin protective layers (not shown in FIG. 1) that may be formed over the leads and pads. Thus, if the layers 58,60 are adhered to one another solely at their outer perimeter, there would be a tendency for the two layers to detach from one another, particularly as the entire device is intentionally made very thin and relatively flexible. However, the centrally located bonded interconnection between the two covers 58,60 greatly decreases any tendency of the protective layers to delaminate.

Figure 3:
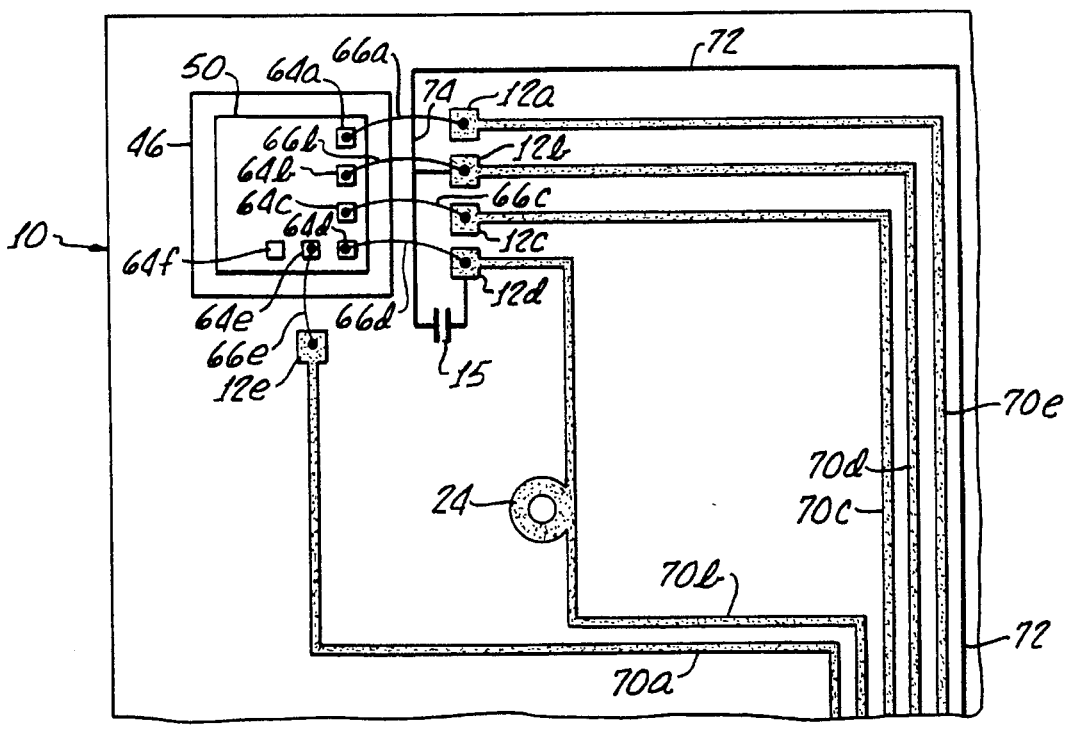
FIG. 3 is an enlarged fragmentary view of certain electrical connections and physical arrangements of electrical components on the transponder of FIGS. 1 and 2.

FIG. 3 illustrates one form of mounting of a die on the die bond site 46. The latter is formed as a thin rectangular sheet of relatively stiff material, such as a copper or other metal, slightly larger than and of the same configuration as the die 50. The die is adhesively secured to the bond site 46, and its die pads 64a–64e are connected respectively to the bond pads 12a–12e by suitable means, such as wire bonds 66a–66e. The programming pads 14a–14e are connected to the respective bond pads by means of leads 70a–70e, inclusive. A final outer turn 72 of near side antenna coil 26 extends vertically (as viewed in FIG. 3) and includes a portion 74 which extends around the bond pad 12a for connection to bond pad 12b. One of the programming leads 70a–70e, namely lead 70b which interconnects programming pad 14d with bond pad 12d, connects to the end of via 24 on the first side of the substrate. Accordingly, the end of the antenna coil 31 on the observe side of the substrate is connected to the die by means of the via 24, bond pad 12d, and wire bond 66d. The outermost end of the coil 26 on the near side of the substrate is connected by means of the portion 72 of its connecting lead to bond site 12b, which is connected to the die pad by wire bond 66b. If the self capacitance of the two coils is not sufficient, an additional capacitor 15 is mounted on the substrate near the die bond site and connected across the antenna by connection to bond sites 12b and 12d, as illustrated in FIG. 3. The die is located at a corner of the transponder assembly, rather than at some interior position, because the corners of the very flexible transponder cared are less subject to bending. Repeated bending could be detrimental to the die and its connections.

The described transponder may be made by any suitable well-known flex circuit fabrication techniques, including photolithography or various forms of subtractive (etching) or additive formation of circuitry. Presently preferred is an additive formation of circuitry which involves the electroforming or other deposition of the various circuit elements on the dielectric substrate. For electroplating the substrate may be seed coated with nickel or copper, or the like. After forming the desired pattern by electroplating on top of the seed layer, the seed layer between circuit traces is flash etch removed. Other additive processes can be used; the "shadow" and "bayer" processes are examples. Any of these processes can be used to adhere copper circuit traces to base substrate material. The circuit traces, thus formed, form the turns of the coils 26 and 31 on both sides, the wire bond and program pads 12 and 14, and the die bond site 46, all of which are formed of thin electroplated copper, for example, and all formed in the same process step. Plated through vias can be formed by pre-drilling the substrate prior to plating. Preferably the coil lines or turns and line spacing are each in the order of 2 mils or less. Smaller line width and smaller spacing enables the use of a larger number of coil turns on each side of the substrate. In fact, with lines and line spacing small enough, all of the coil turns may be grouped in relatively small narrow perimetrical areas extending around the outer edges of the substrate (as will be described below in connection with FIG. 8), thereby leaving a relatively large area within the center of the substrate that is free of all coil turns. Thus, a larger number of magnetic flux lines may be encompassed by each of the coils.

Figure 8:
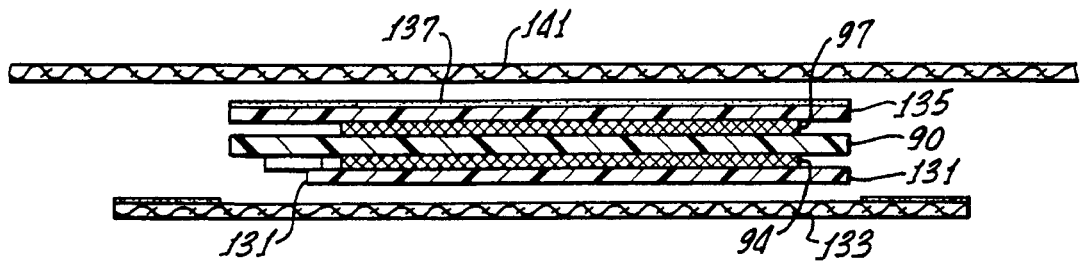
FIG. 8 is an elevation cross-section of the laundry tap of FIGS. 6 and 7.

Such an arrangement of grouping coil turns in relatively narrower bands around the outer edges of the substrate and leaving a large interior area free of coil turns can significantly increase performance of the transponder, increasing read range and sensitivity. However, as coil turns become smaller in width, line thicknesses decrease, so that a 2 mil line, for example, may have a thickness in the order of about 0.35 mils. If the turns are too great in number and too small in cross-section, resistance of the coil increases significantly, and thus there is a tradeoff between minimizing line width to obtain desirably increased numbers of lines and coil turns and undesirably increased coil resistance. In general, however, a given number of turns of relatively wide lines covering the entire area of the substrate does not yield as good a performance as does the same number of turns of smaller width lines (and smaller width spaces between lines) that are grouped together near edges of the substrate, thereby leaving a larger area at the interior of the substrate free of coil turns. Grouping of the turns near the substrate edges with a free area at the interior, as illustrated in FIG. 8, provides better performance in reading range and greater energy transfer from the exciting field to the coil. Also, a larger area for bonding the PVC outer covers in the middle results.

The desired pattern of narrow lines and pattern of pads and die bond site are electroplated or otherwise electroformed on the thin polyamide, polyester or other flexible nonconductive substrate on the substrate as a first step. The coil turns, as previously described, are in registration from front to back, so that distributed self-capacitance and self-inductance occurs from one side of the substrate to the other, with the coil portions on opposite sides being connected to one another by the vias. The latter are also coated with the metal of the lines, which may be copper or aluminum. As previously described, the coils are connected in series and wound in an aiding relation. The close proximity of the turns, separated only by the very thin 1 mil thick substrate, results in mutual coupling and a total inductance increase of as much as 27% as compared with a typical PC board of 10 or 12 mil thickness, for example. A greater increase in mutual coupling and total inductance may be obtained by using a still thinner (less than 1 mil) substrate. A preferred substrate is an adhesiveless laminate material (a polyimide clad with copper on both sides), so that there is no additional thickness of adhesive added between the planar coils. The coils, pads and bond site are formed from the copper cladding. As mentioned above, the preferred coil turns and spaces are as narrow as possible and grouped toward the outer perimeter of the substrate to leave a large unobstructed free area at the interior of the substrate.

The die 50 is mounted on the die site 46 with a suitable adhesive. Various types of die mounting and connection are available, including wire bonding (shown in FIG. 3 and described above) and flip-chip mounting (shown in FIG. 9 and to be described below). Illustrated in FIG. 3 is a wire bonding connection in which wire bonds 66a–66e are employed to interconnect the die pads with the bond pads.

Preferably a thin protective coating (now shown) is applied to both top and bottom of the structure prior to the mounting of the die. A hole or rebated portion is left in this protective coating to leave the die bond site, bond pads and program pads free of the protective coating until after the die is mounted and connected. Then, after adhesively mounting and electrically connecting the die to the bond pads, an epoxy encapsulation (now shown) is applied over the die, the wire bonds and the bond pads for protection and rigidifying of the die and its wire bonds. Preferably, in order to maintain the total thickness of the resulting transponder as small as possible, the die is back-lapped prior to mounting. That is, the die is ground or otherwise treated to decrease its thickness from a manufactured thickness in the order of about 20 mils to a decreased thickness of about 10 to 12 mils. Any smaller thickness of the die could result in a die too brittle to withstand any significant handling or use.

Thereafter the die is programmed by direct electrical contact of a programming apparatus (not shown) with the programming pads 14a–14e that are provided adjacent one edge of the substrate. In this programming an unique number or other identification is written into and fixed in the die memory to be read out for identification upon interrogation by an energizing exciter RF Signal. If deemed necessary or desirable, these programming pads may be cut off, together with appropriate portions of the substrate, after the programming is accomplished to reduce overall size of the structure and to prevent disturbance of the die by ESD (electrostatic discharge). Prior to the programming, the outermost protective laminates 58,60 have not yet been applied. Now, after programming, the two outermost protective layers 58,60 are applied to the substrate with its coils, die and pads, and are pressed together at a suitably high temperature to cause the material of the outer protective layers to soften and flow together, thereby adhesively bonding the two outer laminates 58,60 securely to one another continuously around outer edges of the protective layers and also at central portions thereof through the slot 20 in the substrate 10. The two outermost layers 58,60 of course also bond to one another through the rebated portion 18 of the substrate, leaving the mutually registering slots 61a and 61b to extend through the finished product for reception of a securing strap or the like.

Figure 4:
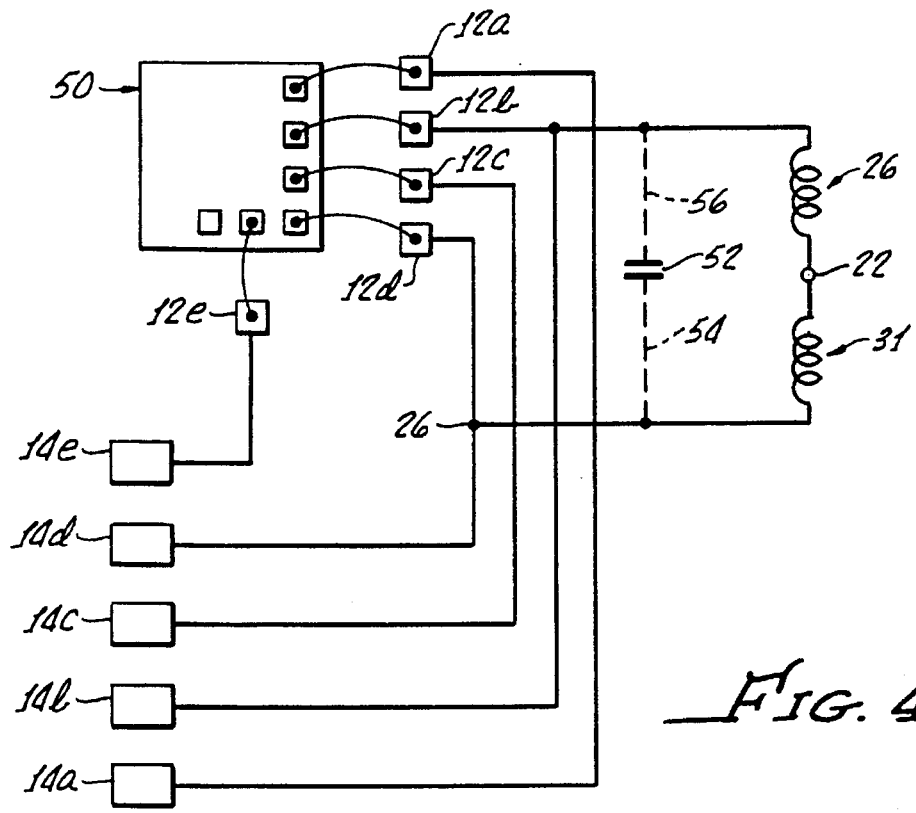
FIG. 4 is an electrical schematic diagram of the transponder of FIGS. 1–3.

FIG. 4 shows an electrical schematic diagram of the transponder of FIGS. 1 through 3, illustrating the two series wound coils 26,31 connected to one another by means of via 22, and connected at opposite ends thereof to contact pads on die 50 through bond pad 12b for coil 26 and through via 24 and bond pad 12d for coil 31. The five programming pads 14a–14e are connected to the bond pads 12a–12e, which are connected by wire bonds to the die contact pads, as described above. In one particular arrangement programming pads 14b and 14a are used for application of minus and plus AC respectively. Pad 14a is used for program voltage ground, pad 14c, for program voltage, and pad 14e for a negative DC connection. The unconnected die pad contact may be employed for test purposes.

Also shown in FIG. 4 (in dotted lines) is a capacitor 52 that may be connected by means of leads 54,56 across the ends of the series connected antenna coils 26,31 to provide additional capacitance when necessary. As previously described, the capacitor 52 may be in the form of a chip capacitor or film capacitor 15 (see FIG. 3) mounted on the substrate adjacent the die bonding site. Additional capacitance may alternatively be provided by use of parallel plate capacitors mounted in the manner illustrated in FIG. 5 and described below.

Figure 5:
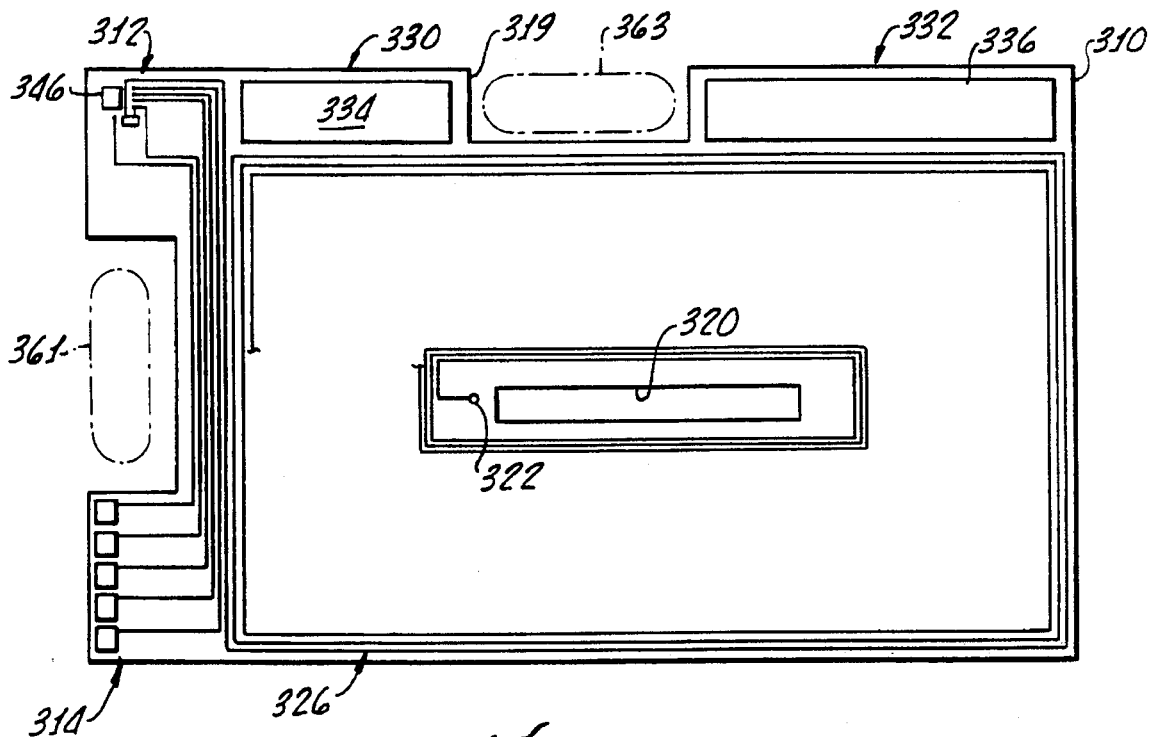
FIG. 5 illustrates a modification of the configuration of the transponder of FIGS. 1–3, having dual carry strap slots and parallel plate capacitors.

Illustrated in FIG. 5 is a modified form of identification transponder card which is modified to incorporate a second carrier strap slot and a pair of parallel plate capacitors. FIG. 5 illustrates only the substrate and components mounted on one side of the substrate. Omitted from the showing of FIG. 5 are the outer protective laminates, interior protective coatings, and the obverse side coil, all of which are the same as corresponding elements of the transponder of FIGS. 1–3. Components of the transponder of FIG. 5 that are the same as corresponding components of FIGS. 1–3 are designated by the same reference numerals augmented by 300, so that, for example, substrate 310 of FIG. 5 corresponds to substrate 10 of FIGS. 1–3. A substrate 310, which may be substantially identical except for slight changes in configuration to the thin substrate 10, is formed with an interior slot 320 and a through via 322 which is connected to one end of a near side antenna coil 326. Also formed on the substrate are a die bond site 346, a plurality of bond pads 312, and a plurality of program pads 314 interconnected by a group of connecting leads 370. The several electrical components, including an observe side coil (not shown in FIG. 5), are connected in the manner described above in connection with the transponder card shown in FIGS. 1 through 4. The substrate is rebated, as at 308, to allow for formation of a first carrier slot 361 (shown in dotted lines in FIG. 5) that is to be formed in the outer protective laminates (not shown in FIG. 5). Along the long side of the card is formed a second rebated portion 319 that allows for the formation of a second carry strap slot 363 to be formed in the outer protective laminates (not shown in FIG. 5). The provision of the pair of slots gives flexibility of use to the card user.

On either side of the long edge rebated portion 319 at areas 330 and 332 are formed substantially rectangular copper capacitor plates 334,336 that are electroplated on the substrate 310 together with the electroplating of the other circuit elements. At the same time corresponding mating and aligned halves of capacitor plates 334,336 are formed on the obverse side of the substrate so that plate 334, together with its mating half on the obverse side, and also plate 336, together with its mating half on the obverse side, each forms a separate parallel plate capacitor separated only by the very small thickness of the thin substrate 310. These capacitors also may be connected in series or parallel across the antenna coil as desired, thereby adding additional capacitance, if coil self-capacitance is considered to be insufficient. The antenna coils, as can be seen in FIG. 5, cover an area of the substrate that extends nearly to the right and bottom substrate edge (as seen in FIG. 5) and nearly to the inner edges of rebated areas 315,319 at the left and top, closely circumscribing interior slot 320.

Figure 6:
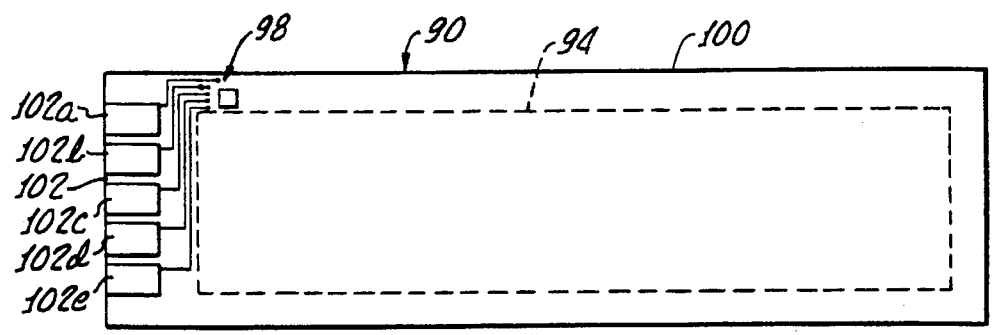
FIG. 6 shows a transponder configured for use as a laundry tag.
Figure 7:
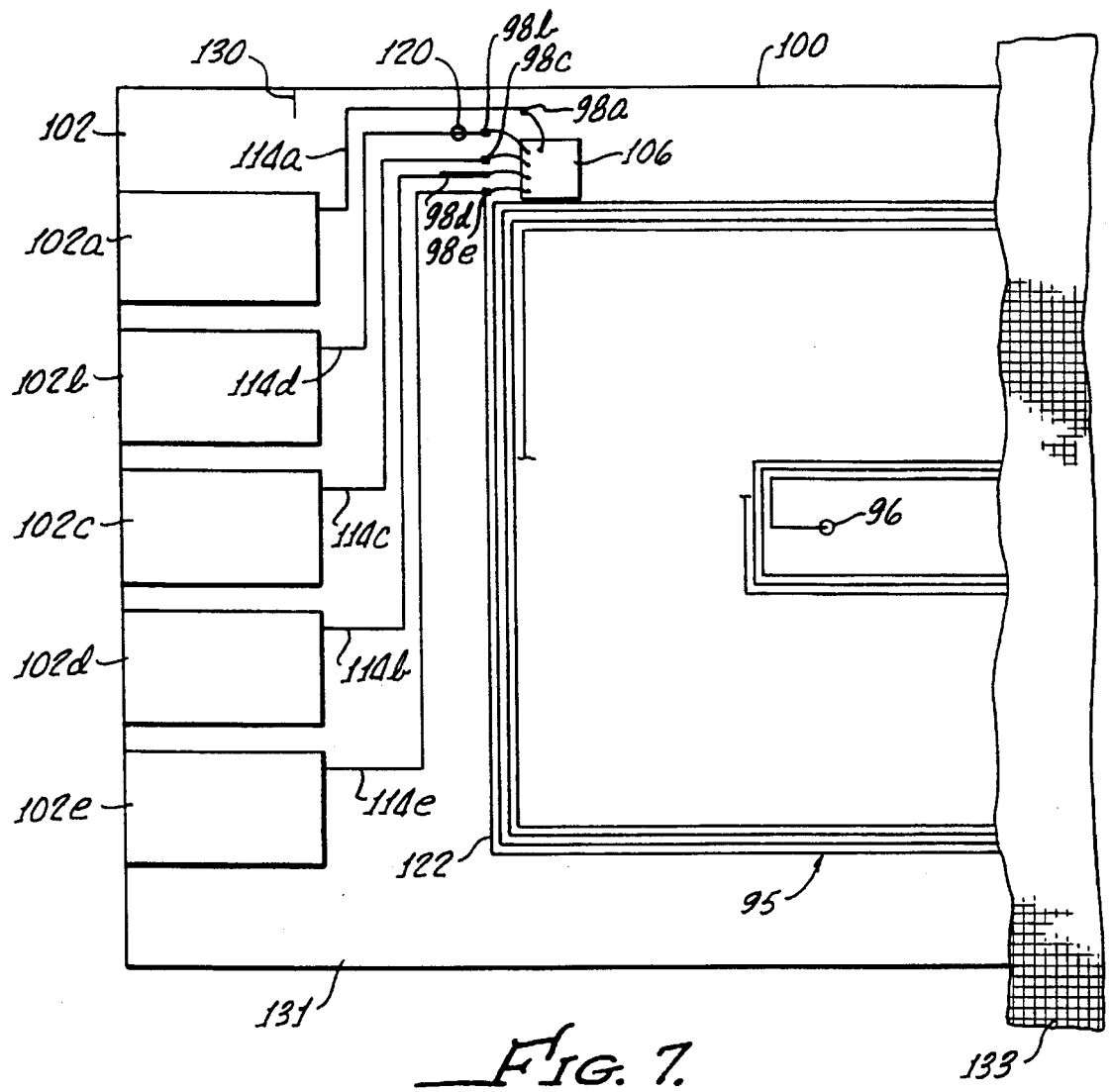
FIG. 7 is an enlarged fragmentary view of portions of the laundry tag transponder of FIG. 4.

The transponder illustrated in FIGS. 1 through 4 and described above is specifically designed for use as a personal identification card that is to be placed near but not in contact with an exciter and which will transmit to the exciter information identifying the specific identification card and the person holding it. Among many other applications of transponders of this type is its use as a laundry tag for identification of specific pieces of clothing. Such a laundry tag transponder is illustrated in FIGS. 6 and 7 as including a substrate 90 of the same thickness and material as the substrate of the prior embodiment but is smaller, having a relatively long narrow shape that is more readily bonded to a piece of clothing. In an exemplary arrangement of a laundry tag transponder the substrate, which may be formed of an adhesiveless laminate (copper on each side of a 1 mil polyimide substrate) or polyimide or polyester of 1 mil thickness has a length of about 3.6 inches and a width of 1 inch. An antenna coil 95 is formed on the substrate (as by etching the copper cladding), covering an area indicated by dotted line 94 in FIG. 6. A similar antenna coil (now shown in FIG. 6) is wound on the other side of the substrate, and, just as in the previously described embodiments, the two coils have interior end portions thereof connected through a via, such as via 96, extending through the substrate and have their turns in precise alignment and mutual registration on opposite sides of the substrate to provide improved mutual inductance and capacitance. Both coils, as described above in connection with other embodiments, are wound in the same direction when viewed from the near side. A plurality of bond pads 98a–98e are formed at an area adjacent one long edge 100 of the substrate and spaced inwardly a significant distance from a short edge 102 of the substrate. A major portion of the area of the substrate adjacent short edge 102 is occupied by a plurality of programming pads 102a–102e, each of which is formed with an outermost edge extending to the edge 102 of the substrate, for reasons to be described below. Positioned inwardly of the bond pads is a die site 106 on which is mounted a die 108 having a plurality of die pads 110a–110e that are connected by wire bonds 112a–112e to the respective bond pads. A group of leads 114a–114e interconnects the bond pads with the inner sides of the program pads. A second via 120 extends through the substrate for connection to an end of the antenna coil (not shown) that is wound on the obverse side of the substrate. An end portion 122 of the near side coil 95 is connected to bond pad 98e, and the inner end of the coil 95 is connected to the via 96, and by means of such via is connected to the inner end of the corresponding coil on the obverse side of the substrate.

The second via 120 extends through the substrate at a point connected to lead 114b that interconnects bond pad 98b with program pad 102b. The program pads are generally elongated in the direction of the length of the laundry tag, having shorter dimensions in the direction of the short edge of the substrate so as to enable closer spacing of the program pads in this transverse direction.

The fabrication process of the described laundry tag is generally the same as the fabrication process described in connection with the personal identification card of FIGS. 1 through 3. The antenna coils on both sides, the die bond site, the bond pads and the programming pads and all interconnecting leads are formed preferably by additive processes on the one side of the substrate that is visible in FIG. 3. In the same processing step the antenna coil is formed on the obverse side. The two vias, previously drilled, are conductively plated in this same step. Thereafter the coils on both sides are covered with a thin layer 131 of a protective dielectric. This may be a conventional etchant maskant applied in liquid form. Alternatively, a layer of Kapton about 1 mil thick is adhered to the substrate and coils with a suitable adhesive. The Kapton or other liquid maskant protective layer is arranged to cover the entire obverse side of the substrate, including the coils and vias on such obverse side. However, on the near side the Kapton covers only the innermost edge of the programming pads, that is, the interior edge portion to the right of a line indicated at 130 in FIG. 7, and also covers the various leads 114, but does not cover the die bond site nor the bond pads on the near side. The Kapton coating, accordingly, leaves outermost portions of each of the programming pads exposed for a length (in the direction of the length of the elongated laundry tag) of approximately 0.21 inches. Each programming pad, in a particular example, has a length of approximately 0.230 inches and a width of 0.130 inches, being spaced apart by a distance of 0.030 inches. Thus the Kapton or other protective layer covers only a 0.02 inch portion of the inner ends of the program pads. The bond pads and the programming pads may be flash plated with a thin layer of nickel and gold for wire bonding and environmental stability, respectively. Die 108 is then adhesively mounted upon and secured to the die bond site 106, and the several wire bonds are formed connecting the pads on the die with the bond pads. After completing the wire bonding of the die pads, the entire area around the die and including the bond pads and the wire bonds are sealed with a suitable epoxy. Preferably the height of the epoxy and the height of the wire bonds is minimized to maintain a minimum thickness of the finished product.

After the above process steps have been completed (with major portions of the programming pads remaining exposed), the laundry tag program pads 102a–102e are connected to suitable programming circuitry to program the die with the desired identification information, which may simply be a specific identification number. After this programming, both sides of the entire end of the substrate, including the outer ends of the program pads up to the line 130, is cut off. Thus the length of the laundry tag is decreased for ease of use and exposed portions of program pads are eliminated.

The programmed laundry tag, with both sides completely covered by a thin protective coating 131 now has a heat bondable adhesive bonded to one side (the obverse side as seen in the drawings) and the entire tag is heat bonded to a garment that will be identifiable by this tag. Finally a strip of cloth 133 slightly larger than the tag is placed over the entire tag and heat bonded along its periphery. For use in identification of an individual piece of clothing, the cloth laundry tag is then thermally bonded to a garment by the final cloth strip 133, preferably at a laundry which is set up to process and maintain control and identification of numbers of such garments.

As shown in the cross-section of FIG. 8, the laundry tag with its several layers, substrate 100, coils 94 and 97, outer dielectric protective layer 131, inner dielectric protective layer 135, and heat bendable inner adhesive layer 137, is first bonded to a garment 141, and then covered with the cloth strip 133 which is bonded to the garment around the periphery of the tag.

Figure 9:
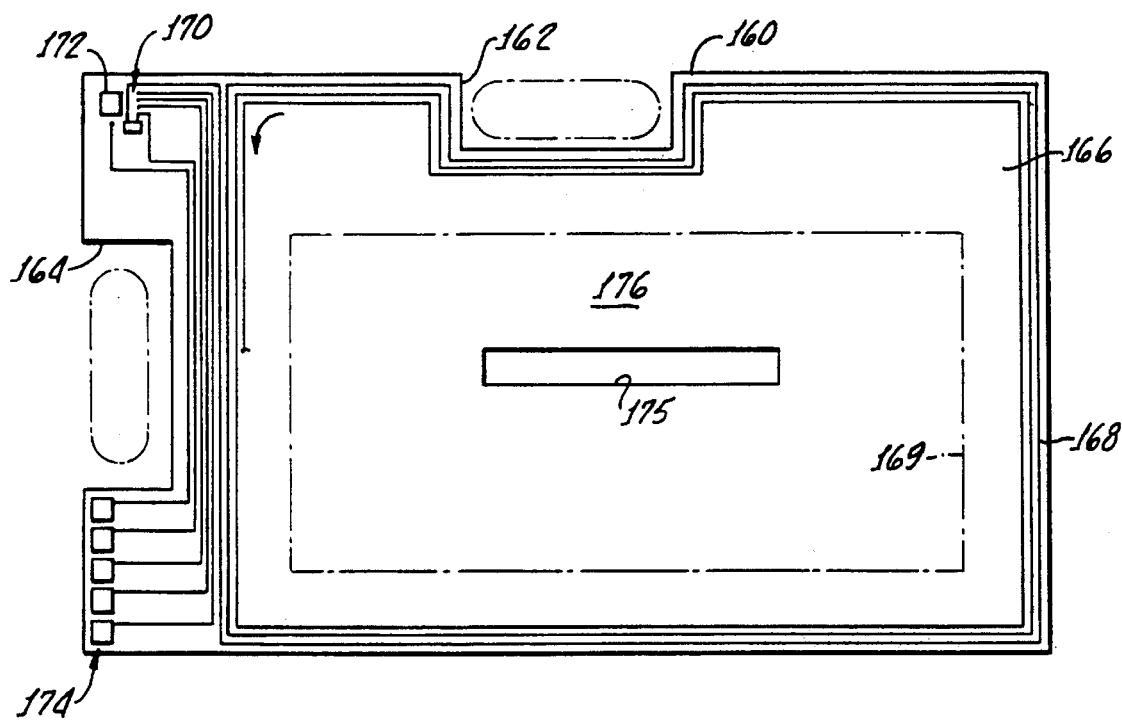
FIG. 9 illustrates a modified transponder configuration having dual carry strap slots and turns bunched at the substrate perimeter.

As mentioned above, improved performance, and particularly improved range, may be obtained by grouping all of the turns of both coils in narrow perimetrical areas along the outer edge portions of the substrate, thereby leaving the relatively large interior area completely within the coils free of coil turns. Such a transponder arrangement is schematically shown in FIG. 9 wherein a substrate 160 is formed with rebated portions 162,164 along one long and one short edge to accept one or the other of the carry strap slots formed in the transponder protective PVC laminate covers (not shown). An antenna coil 166 (and a corresponding coil (not shown) on the obverse side) has its turns bunched in a narrow area around the substrate edge, as indicated by lines 168,169 that represent outer and inner coil boundaries. Bond pads 170, die site 172 and program pads 174 are formed on the substrate as previously described. A slot 175 to allow mutual bonding to the two outermost protective PVC laminates (not shown) is formed in the unoccupied center area 176, within the coil. This area may mount parallel plate capacitors (not shown in FIG. 9) if needed for resonance, where the coils self-capacitance is not sufficient. This arrangement is closer to an air wound coil in performance, and preferably uses coil turns having a width of one to two mils with one to two mil turns spacing.

In an arrangement such as shown in FIGS. 1–3 or 6 and 7 the die may be a pre-programmed die so that a specific identification number is programmed into the die during the manufacture of the die. Accordingly, with use of this type of die no program pads are needed on the transponder. Such a pre-programmed die, used in a transponder with no program pads, may be used in various types of arrangements, including use as a laundry tag. In a laundry system it is only necessary that the different transponders or tags have individually unique numbers or other identifying indicia, and it may not be necessary or desirable for the laundry operator to be able to select individual identifying numbers for programming into the specific tags.

In a personal identification transponder, on the other hand, it is often desirable for a specific company or organization that uses identification cards for its employees to insert its own identification system into the die. Such identification systems may include not only an individual employee identification number, but also a facility, building, room number, or group of room numbers to which access may be specifically controlled by the transponder, such that only those transponders with a particular room or facility number would be allowed access.

The die bond sites, formed of a sheet of metal, such as copper, of a generally rectangular shape or other configuration, provide desirable stiffening of that portion of the very thin and highly flexible substrate at which the die is mounted. The die bond site physically stabilizes and stiffens the area including the die and the bond pads. Thus, with such stiffening, there is less flexing of the various leads at this portion of the circuit where connections are made, and less flexing of the wire bond.

Figure 10:
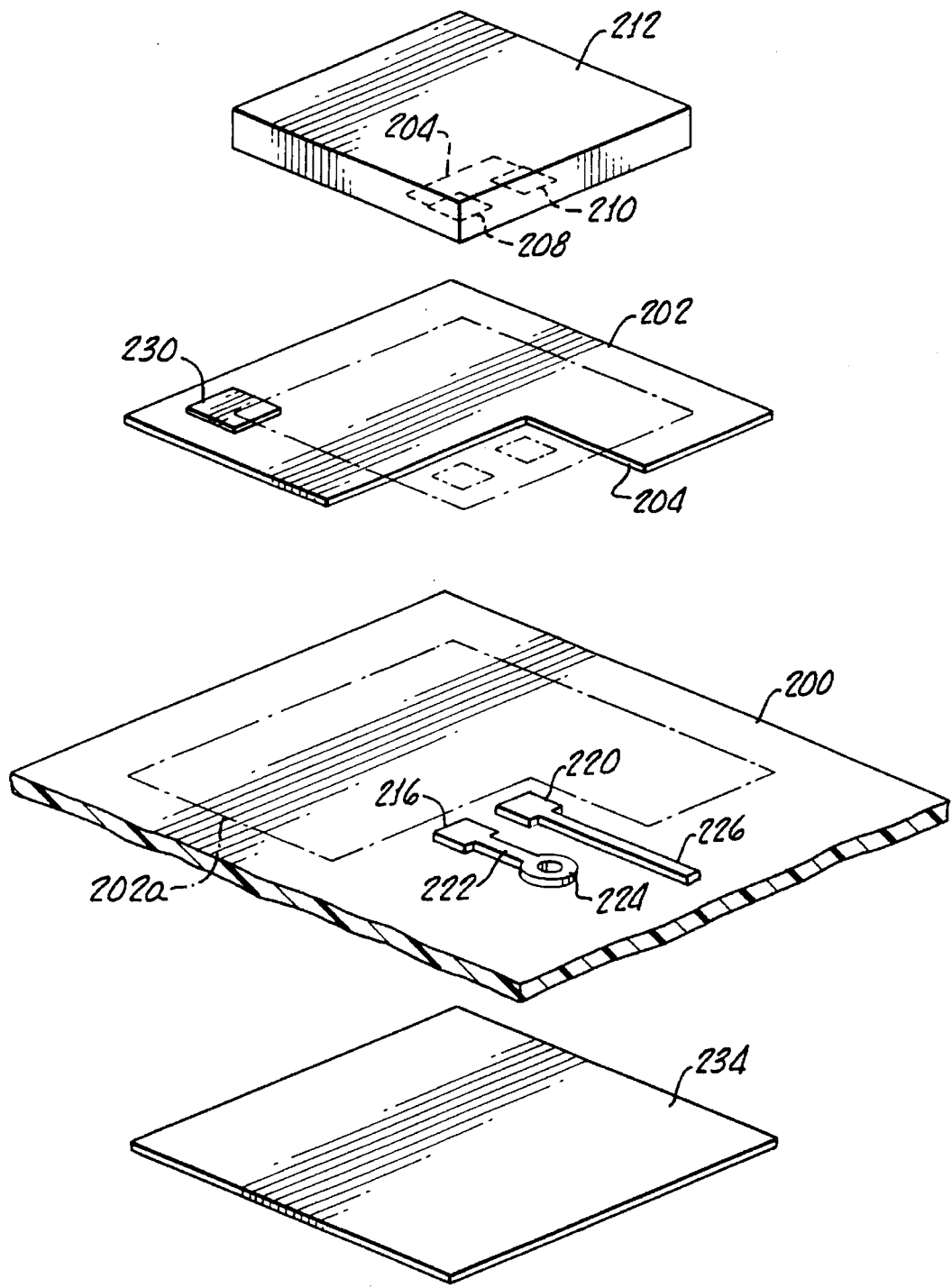
FIG. 10 is an exploded pictorial view of an arrangement for mounting a flip-chip and stiffening the thin substrate.

Such a stiffening arrangement, together with a flip-chip mounting of a die, is illustrated in the enlarged fragmentary exploded view of FIG. 10. FIG. 7 illustrates only a corner portion of a substrate with its die mounting site and bond pads, but does not show the antenna coils and the remainder of the transponder structure which otherwise may be identical to the transponders previously described. As illustrated in the fragmentary showing of FIG. 10, a substrate 200, which may be a polyamide, polyester of very small thickness, such as 1 mil or the like, has a die bond site 202 secured to one surface thereof in the area indicated by the dotted line 202a. The die bond site is generally rectangular, having a rebated portion or recess 204 that is cut away to encompass a pair of die connecting pads 208,210 shown in dotted lines at a lower surface of a die 212. The two die pads are spaced close to one another and positioned at one corner of the die. At an area of the substrate that is within the cut out or rebated portion 204 of the die site but closely adjacent thereto a pair of die bond pads 216,220 is mounted. Die bond pad 216 is connected by a lead 222 to a via 224 that extends through the substrate for connection to an end of an antenna coil (not shown) formed on the obverse side of substrate 200. A lead 226 connects die bond pad 220 to an end of the antenna coil (not shown) on the near side of the substrate. A third or die support pad or support leg 230 is formed directly on the die bond site 202a to provide a third stabilizing support leg for the flip-chip mounting of the die 212. The die support pad 230 performs no electrical function, but is provided solely for physically stabilizing the die mounting. The third support helps to level the die to ensure a space between the die and bond site for application of die bonding epoxy.

As previously mentioned, the metal die bond site 202 provides a stiffening for a portion of the thin, flexible substrate. This stiffening is enhanced in the described arrangement by a second metallic stiffening sheet 234 having dimensions substantially the same as dimensions of the near side die site 202 but having no rebated portion. The obverse side stiffening sheet 234 is formed on and securely bonded to the obverse side of the substrate in alignment and registration with the die site stiffening sheet 234. The die is flip-chip mounted by positioning the die over the die site 202 with its die contacts 208,210 in direct engagement with the die bond pads 216,220 on the substrate. To provide a three point physical support for the die, the die support pad 230 is formed upon the die bond site 202 so as to contact an underside of the die that is spaced from the two die contact pads. The area between the die bond pads and the die support pad 230 may have a height above the substrate in the order of 1 to 2 mils, and the space between the die bond site 202 and the die is filled with a suitable rigidifying electrically nonconductive epoxy that stabilizes the die to the bond site and that adhesively secures the die to the die site.

In the arrangement illustrated in FIG. 10 the stiffening die bond site 202, the stiffener 234, the die bond pads 216,220 and the die support leg 230, together with the leads 222,226 and the two antenna coils on opposite sides of the substrate (not shown) are all formed by suitable, preferably additive, processes, such as those described above. Again, the antenna coils, but not the die bond pads, may be coated with a thin layer of liquid dielectric or Kapton, and the entire obverse side including stiffener 234 may also be coated similarly. After the mounting of the die on the substrate the die and immediately adjacent areas are encapsulated with suitable electrically nonconductive epoxy. The entire assembly is then laminated between a pair of polyvinylchloride protective layers, as with the previously described personal identification card, or may be covered with a cloth, as described above in connection with use as a laundry tag.

The arrangement illustrated in FIG. 10 provides greatly improved stiffening in the area of the die mounting and in the area at which the connections are made between the antenna coils and the bond pads.

There have been described several different configurations and methods for assembly of improved transponders in which manufacturing is simplified and enhanced because of specific structure and configuration of the transponders and in which transponder performance is improved by configurations that enable close grouping of very narrow antennal coil lines and spaces and the bunching of antenna coil turns in narrow perimetrical areas of the substrate. The substrate is made of a very thin material to allow the two coils on its opposite sides to be positioned very close to one another, and the two coils are positioned in alignment and registration so as to improve inductance and capacitance.

What is claimed is:

1. A method for making a radio frequency identification transponder comprising the steps of:

forming a thin dielectric substrate having first and second sides;

forming a die bond site on said first side;

forming a plurality of bond pads on said first side adjacent said die bond site;

forming a first multi-turn flat antenna coil on said first side having a first end at an interior portion of said substrate, and having a second end at one of said bond pads;

forming a first via extending through said substrate and connected to said first end on said first side of said substrate;

forming a second via through said substrate adjacent one of said bond pads;

forming a second multi-turn antenna coil on said second side of said substrate having a first end at an interior portion of said substrate connected to said first via and having a second end connected to said second via on said second side of said substrate; connecting said second via on said first side of the substrate to one of said bond pads;

mounting a die to said substrate at said die bond site;

electrically connecting said die to said bond pads;

forming a dielectric protective coating over both said first and second sides of said substrate and over said antenna coils;

securing a first protective cover to said second side of said substrate over said second antenna coil;

applying a nonconductive encapsulation over said die and said bond pads; and applying a second protective dielectric cover to said first side of said substrate covering and protecting said first antenna coil, said die, and said bond pads.

2. The method of claim 1 including the steps of forming a plurality of programming pads on said first side, and forming a plurality of programming leads on said first side interconnecting said programming pads with said bond pads.

3. The method of claim 2 wherein said step of forming said second via includes forming said second via at a position on said substrate that connects to one of the connecting leads between said bond pads and said die pads.

4. The method of claim 1 including the step of forming a slot in an interior portion of said substrate, and wherein said step of securing a first protective cover and applying a second protective cover comprise bonding said first and second laminates to each other around the periphery of said substrate and through said slot.

5. The method of claim 1 wherein said step of forming a die bond site comprises forming said die bond site as a metallic sheet having a recess, said step of forming a plurality of bond pads comprising forming said bond pads in a pattern within said metallic sheet recess, said step of mounting a die comprising the steps of providing a die having die contact pads adjacent one corner thereof arranged in a pattern that matches the pattern of said bond pads, and positioning said die on said die bond site with said die contact pads in electrical contact with said bond pads.

6. The method of claim 5 including the step of forming a die support pad on said die bond site for supporting, leveling and stabilizing said die.

7. The method of claim 1 wherein said step of forming a die bond site comprises positioning said die bond site at a first corner of said dielectric substrate, said step of forming first and second protective covers including the step of forming first and second fastener apertures at corresponding end portions of said covers and securing said covers with said fastener apertures in mutual alignment with each other.

8. The method of claim 1 wherein said steps of forming first and second antenna coils include forming turns of said coils winding in like directions as viewed from one side of said substrate and forming said coils with turns of said first coil in direct alignment and registration with turns of said second coil.

9. The method of claim 1 wherein said step of forming said first and second coils includes the step of forming coil turns of said first and second coils in a relatively narrow perimetrical area circumscribing interior portions of said thin substrate, whereby a major portion of said substrate on both said first and second sides is free of said antenna coils to provide a large central coil turn free area.

10. The method of making a transponder set forth in claim 1 wherein said step of forming a thin dielectric substrate comprises forming said substrate as a body of generally rectangular configuration, having a pair of opposite short edges and a pair of opposite longer edges, and including the step of forming said die bond site and said bond pads at one corner of said substrate adjacent a first one of said short edges, forming programming pads on said first side at an opposite corner of said first short edge, and positioning said die bond site and said bond pads adjacent one of said long edges and spaced inwardly from said first short edge, said step of forming programming pads including the step of positioning said programming pads closer to said first short edge than said die bond site and said bond pads, employing said program pads to program said die, and further including the step of removing an end portion of said substrate extending along said first mentioned short edge, said step of removing an end portion of said substrate including the step of removing at least outermost portions of said programming pads.

11. The method of making a transponder set forth in claim 10 wherein said step of applying a dielectric protective coating includes applying said protective coating to cover only innermost portions of said programming pads to said bond pads, said step of electrically connecting said programming pads to said bond pads comprising connecting inner sides of said programming pads, said step of removing an outermost portion of said substrate comprising the step of removing outermost portions of said programming pads that are not covered by said protective layer, whereby all remaining portions of said programming pads are covered by said protective layer.

12. The method for making a radio frequency identification transponder as set forth in claim 1 wherein said bond site comprises a metallized stiffening sheet, and including the step of forming a second metallized stiffening sheet on the second side of said substrate in alignment with said first mentioned die bond site.

13. The method for making a radio frequency identification transponder as set forth in claim 1 wherein said die bond site has a recess, and wherein said bond pads are positioned within said bond site recess, and including the step of mounting said die by connecting die pads of the die directly to said bond pads, said bond pads being arranged in a configuration that mates with the configuration of a set of connecting pads on said die.

14. A radio frequency identification transponder comprising:
   a thin dielectric substrate having first and second sides, said first side having a die bond site and a plurality of bond pads formed thereon adjacent said die bond site;
   a first multi-turn flat antenna coil on said first side having a first end at an interior portion of said substrate, and having a second end connected to one of said bond pads;
   a first via extending through said substrate and connected to said first end on said first side of said substrate;
   a second via extending through said substrate adjacent one of said bond pads;
   a second multi-turn flat antenna coil on said second side of said substrate having a first end at an interior portion of said substrate connected to said first via, and having a second end connected to said second via on said second side of said substrate;
   a dielectric protective coating over both said first and second sides of said substrate and over said first and second antenna coils, said protective coating being open at said die bond site and at said bond pads, whereby said die bond site and said bond pads are not covered by said protective coating;
   an electrical lead connecting said second via on said first side of the substrate to one of said bond pads;
   a die mounted to said substrate at said die bond site and electrically connected to said bond pads;
   a first protective cover secured to said second side of said substrate over said second antenna coil;
   a non-conductive encapsulation secured to said first side of said substrate, over said die and over said bond pads; and
   a second protective dielectric cover secured to said first side of said substrate covering and protecting said first antenna coil and said die and bond pads.

15. The transponder of claim 14 wherein said substrate is a flexible material having a thickness of not more than about twenty-five microns, and wherein said die bond site comprises a stiffening sheet of metallization on at least one side.

16. The radio frequency identification transponder of claim 14 wherein said substrate has an opening at an interior portion thereof, said first and second antenna coils being clear of said opening, said first and second protective covers being bonded to each other at peripheral edges thereof, and through said opening.

17. The radio frequency identification transponder of claim 14 including a plurality of programming pads formed on said first side of said substrate, a plurality of programming leads on said first side interconnecting said programming pads with said bond pads, said second protective dielectric cover covering and protecting said programming pads.

18. The radio frequency identification transponder of claim 17 wherein said die bond site is positioned at a first corner of said dielectric substrate, and said programming pads are positioned at a second corner of said substrate, said substrate having a portion thereof between said die bond site and said programming pads rebated, said first and second protective covers including mutually aligned fastener apertures aligned with each other and with said rebated portion of said substrate.

19. The radio frequency identification transponder of claim 18 wherein said die bond site comprises a layer of relatively stiff material on said first side.

20. The radio frequency identification transponder of claim 18 including means for stiffening said thin substrate in the region of said die bond site and said bond pads.

21. The radio frequency identification transponder of claim 20 wherein said means for stiffening comprises a first thin sheet of metal bonded to said first side at a region of said first side that covers said die bond site, and a second thin sheet of metal bonded to and covering a portion of said second site that extends along said second side in the region of said die bond site and said bond pads of said first side.

22. The radio frequency identification transponder of claim 14 wherein said antenna coils on said first and second sides of said substrate are wound in like directions, as viewed from one side of said substrate, and include at least a major portion of the turns of said first coil in direct alignment and registration with the turns of said second coil.

23. The radio frequency identification transponder of claim 14 wherein coil turns of said first and second coils are positioned in a relatively narrow perimetrical area circumscribing inner portions of said thin substrate, whereby a major portion of said substrate on both said first and second sides is free of said antenna coils to provide a large central area free of coil turns.

24. The radio frequency identification transponder of claim 14 including a layer of heat bondable adhesive secured to said dielectric protective coating on said second side, and configured and arranged to bond said transponder to a garment, and a strip of cloth covering said substrate and dielectric protective coating on said first side and configured and arranged to further secure said transponder to said garment.

25. A radio frequency identification transponder comprising:
   a thin dielectric substrate having first and second sides, said substrate having a perimetrical edge and an opening formed in an interior portion thereof;
   first and second antenna coils on said first and second sides respectively;
   a die mounted on said substrate and connected to both said antenna coils; and
   first and second protective covers enclosing said substrate, coils and die, said covers each being continuous and having mutually aligned perimetrical edges extending beyond the perimetrical edge of said substrate, said protective covers being bonded to one another at portions of their perimetrical edges, said protective covers including interior portions thereof extending through said opening in said substrate interior portion and being bonded to one another through said opening, said protective covers having substantially smooth continuous planar exterior surfaces that extend beyond said opening and said interior portion.

26. The radio frequency identification transponder of claim 25 including a dielectric protective coating covering substantially all of the surface of one side of said substrate and substantially all of the surface of the opposite side of said substrate, the area of said substrate at and around said substrate opening being free of said dielectric coating, said first and second protective covers being bonded to one another only at said interior portion of the substrate through said substrate opening and at perimetrical portions of said protective covers that extend beyond the perimetrical edge of said substrate.

27. The radio frequency identification transponder of claim 26 wherein said die is mounted on a die bond site of said substrate, and including a stiffening sheet extending over said die bond site and a small distance beyond said die bond site on said first side of said substrate.

* * * * *

UNITED STATES PATENT AND TRADEMARK OFFICE
CERTIFICATE OF CORRECTION

PATENT NO. : 5,574,470
DATED : November 12, 1996
INVENTOR(S) : Franklin B. de Vall It is certified that error appears in the above-indentified patent and that said Letters Patent is hereby corrected as shown below:

Column 3, line 55: delete "3 1/2" and insert -- 3 1/2 --.
Column 6, line 38: delete "now shown" and insert -- not shown --.
Column 6, line 45: delete "now shown" and insert -- not shown --.
Column 7, line 57: delete "observe" and insert -- obverse --.
Column 8, line 38: delete "now shown" and insert -- not shown --.
Column 13, Claim 5, line 9: delete "the-steps" and insert --the steps--

Signed and Sealed this

Eleventh Day of February, 1997

Attest:

BRUCE LEHMAN

*Attesting Officer*  *Commissioner of Patents and Trademarks*